May 31, 1966 U. LOB 3,254,275

SILICON SEMICONDUCTOR DEVICE HAVING PARTICULAR DOPING CONCENTRATIONS

Filed April 16, 1963

United States Patent Office 3,254,275

Patented May 31, 1966

3,254,275

SILICON SEMICONDUCTOR DEVICE HAVING PARTICULAR DOPING CONCENTRATIONS

Udo Lob, Munich, Germany, assignor to Siemens-Schuckertwerke Aktiengesellschaft, a corporation of Germany Filed Apr. 16, 1963, Ser. No. 273,510

Claims priority, application Germany, Apr. 18, 1962, S 79,057

2 Claims. (Cl. 317—234)

My invention relates to silicon semiconductor devices such as silicon p-n junction diodes or silicon controlled rectifiers, and in a more particular aspect to silicon semiconductor devices to be employed under electric operating conditions apt to involve the occurrence of excessive voltages or spurious voltages, for example peak voltages due to switching, which impose detrimental electric stress upon the silcon semiconductor member, particularly due to the hole-storage effect (Lloyd P. Hunter, Handbook of Semiconductor Electronics, McGraw-Hill Book Company, 1956, pages 4–20 to 4–23), thus impairing the semiconductor member or, in extreme cases, causing it to electrically break down and to become useless for the intended operation. Such excessive voltages may result, for example, from the parameters of the electric load applied to the semiconductor device or to electric parameters occurring in the operation of associated circuitry, for example in switching components or inductivities, or they may be due to the operation of the current supply means from which the semiconductor circuitry is energized.

It is, therefore, a more specific object of my invention to provide a silicon semiconductor member that is virtually insensitive to electric stresses of the above-mentioned kind, particularly to excess voltages due to switching operations. Another, related object is to eliminate or minimize the need for auxiliary circuit components otherwise necessary for over-voltage protection of silicon semiconductor devices.

According to my invention these objects are achieved by incorporating simultaneously and conjointly the following three features in the doped crystalline silicon body of the semiconductor device:

(a) The crystalline silicon body comprises a weakly doped intermediate region of n-type or p-type conductance and two tightly doped regions of respectively different conductance types which adjoin the intermediate region on opposite sides thereof so that one of the highly doped regions forms a p-n junction with the intermediate region whereas the other highly doped region forms an ohmic junction with the intermediate region. The two highly doped regions are contacted by electrodes or other contacting means which apply a voltage across the junctions during the operation of the device. According to one of the features of my invention, the dopant concentration in the weakly doped intermediate region is at most $10^{15}$ atoms per cm.$^3$, while the dopant concentration in each of the highly doped zones, usually constituting the electrode-coated surface regions of the semiconductor body, is in the order of about $10^{18}$ to $10^{20}$ atoms per cm.$^3$.

(b) As mentioned above, a p-n junction and an ohmic junction are formed in the silicon body between the intermediate region and the adjacent highly doped or surface regions. It is further essential to my invention that the local distribution curve of the dopant atoms over the distance from the front of the highly doped region doped into the semiconductor body does not exceed a given gradient. Expressing the dopant concentration as the number of dopant atoms per cm.$^3$ and the distance from the particular junction in cm., the gradient of the dopant concentration or distribution has the dimension [cm.$^{-3}$·cm.$^{-1}$]=[cm.$^{-4}$]. This local distrbution or gradient of the dopant atoms in the highly doped regions, according to the invention, is given a value, below the limit of about $10^{17}$ cm.$^{-4}$.

(c) Another, conjointly essential feature of my invention is the necessity of adapting the resistance of the weakly doped intermediate region in a manner which can be most accurately expressed as follows. The thickness of the weakly doped intermediate region in a manner which can be most accurately expressed as follows. The thickness of the weakly doped intermediate region, located between the two highly doped regions and the concentration of the recombination centers in the weakly doped region are given such a ratio relative to each other that the voltage drop between the contacting means of the rectifying path in the semiconductor body, and hence the voltage drop at the respective ends of the current path in the semiconductor body is approximately 1.0 to 1.15 volts when a current of 1 ampere per mm.$^2$ passes in the forward direction through the p-n junction.

This latter feature is satisfied by correspondingly dimensioning for example the thickness of the weakly doped, intermediate region. For example, if it is found that, for the purpose of the present invention, the specific current carrying capacity of the semiconductor member would be too high, the concentration of the recombination centers in the silicon body being too small, then the thickness of the intermediate zone is made correspondingly larger thereby reducing the specific current carrying capacity of the semiconductor member and placing it into the required range at which, for a current density of 1 ampere per mm.$^2$ in the forward direction, the value of the voltage drop in the forward direction at the contacts or electrodes of the semiconductor member does not depart from the approximate range of 1.0 to 1.15 volts.

The invention will be further described with reference to the accompanying drawing in which.

Figure 1:
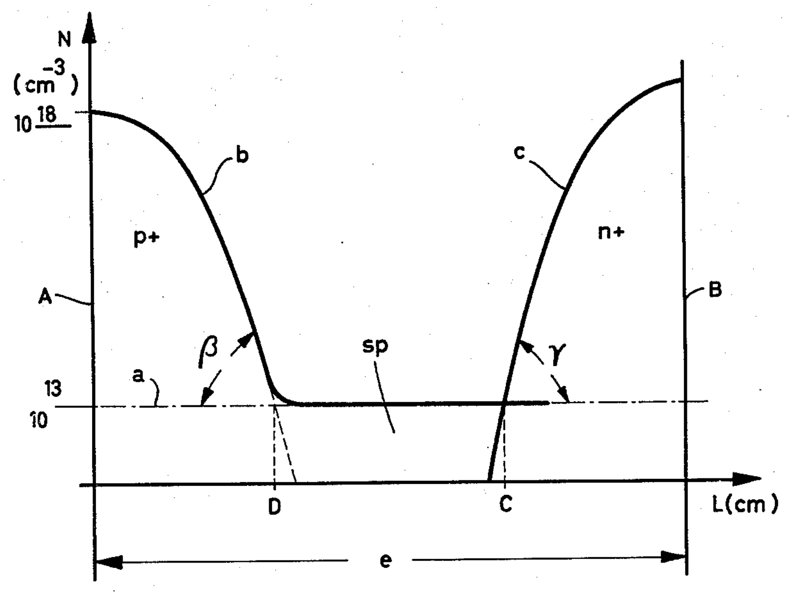
FIG. 1 is an explanatory graph.
Figure 2:
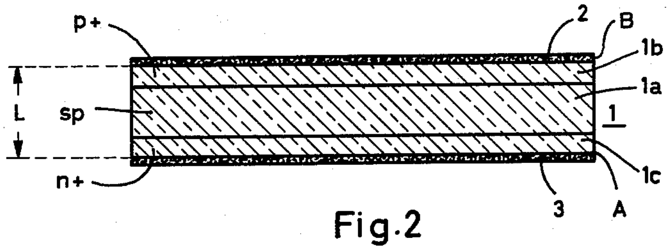
FIG. 2 is a schematic cross-sectional view of a rectifier diode according to the invention.

The coordinate diagram according to FIG. 1 shows, along the abscissa, the distance $e$ between the two surfaces of the silicon semiconductor body such as shown in FIG. 2. The position of these two surfaces is indicated in FIG. 1 by two vertical lines A and B respectively. The ordinate shows the number of dopant atoms N per cm.$^3$. The graph is predicated upon a semiconductor body which originally possessed a uniformly weak p-type doping indicated by sp. The concentration value of the original weak doping is identified in the graph by a line $a$ extending parallel to the abscissa. Doped into this semiconductor body of silicon and commencing from the two surfaces are respective dopant materials. Thus, from the left surface A an amount of boron is doped into the semiconductor body resulting in a dopant distribution for relatively high electric p-type ($p^+$) conductance according to the curve branch $b$ in the semiconductor body. A dopant material for excess-electron conductance, for example phosphorus, is doped into the silicon crystal from the right-hand surface B. As a result, a high n-type doping occurs in accordance with the curve branch $c$, indicating the distribution of the donor-dopant concentration. The dopant concentrations in the highly doped surface region have the highest value at the respective crystal surfaces. At the location where the curve $c$ intersects the line $a$ parallel to the abscissa, a p-n junction occurs in the semiconductor material, the position of this junction, relative to the crystal surfaces A and B, is indicated on the abscissa by the value C. At the location identified by D on the abscissa, relative to the two surfaces A and B, there analogously results an ohmic junction between the two regions of the same electric conductance type, namely p-type, of respectively different degrees of doping.

The distance between the points C and D along the abscissa determines the thickness of the still weakly doped (sp) region between the highly doped regions $p^+$ and n in the semiconductor body.

As explained, it is essential to the invention that the two curves *b* and *c* form with the parallel line *a* respective angles of such magnitude that the inclination, at which these curves commence at line *a*, or at which they intersect line *a*, have a finite value. Since the inclination is determined by the tangent of the angle, each of these angles $\beta$ and $\alpha$ must in each event be less than 90° and consequently be an acute angle in order to meet this requirement of the invention. Such an angle is obtained with difficulty, if at all, when doping the silicon crystal by an alloying process, but is readily obtainable when doping the donor and acceptor substances into the crystal either by diffusion or by simultaneously producing and doping the semiconductor body by pulling it out of a melt.

Among the various methods known for such purposes, the following has been employed to advantage.

A slightly p-doped monocrystal of silicon, in form of a circular wafer as described below with reference to FIG. 2, the dopant consisting of boron, is used as starting material. The proper doping substances, namely boron and phosphorus, are applied to the respective flat surfaces of the semiconductor crystal in the usual manner, for example in pulverulent form or by using the respective dopants as admixtures to electrode metals. The silicon body is then subjected to diffusion temperature, preferably between 1200 and 1300° C.

This method will be more fully understood from the following description of the diode according to FIG. 2. The diode is made from a starting silicon monocrystalline wafer 1 having a diameter of about 20 mm. and a thickness L of about 350$\mu$. The silicon, as mentioned above, has weak p-type conductance. By doping excess-electron (donor) material, for example phosphorus, for example in the manner described in Journal of Electrochemical Society, vol. 105, No. 10, October 1958, pages 591–594, Silverman and Singleton, into the crystal from the surface A, a highly doped n-type region 1*b* of about 65$\mu$ is produced. By doping a defect-electron (acceptor) material, for example boron, into the crystal from the surface B, a highly doped $p^+$-type zone 1*c* is produced. Between these two highly doped regions 1*b* and 1*c* there remains, from the original weakly p-type semiconductor body, a p-type region 1*a* of about 220$\mu$.

After the diffusion-doping is completed, the silicon disc is cleaned in a bath of HF preferably kept in agitation by ultrasonics. Thereafter a contact member or electrode 2, 3 consisting of a coating is deposited upon the crystal surfaces A and B. The electrodes consist, for example, of nickel and are deposited preferably by a chemical, non-electrolytic method. This may be done by immersing the semiconductor crystal in a bath prepared from 30 grams per liter (g./l.) nickel chloride, 10 g./l. sodium hyperphosphate, 65 g./l. ammonium citrate, 50 g./l. ammonium chloride, and ammonium hydroxide in an amount required to obtain a pH value between 8 and 10 approximately as is further described in my copending application Serial No. 273,342 filed on even date herewith and based on German priority S 79,056. The disc is then cut into squares having an edge length of about 1.5 mm. These squares are placed on a carrier and etched by the conventional HF and $HNO_3$ etchant, to an edge length of about 1.3 mm.

In this manner, the finished diode has a voltage drop of about 1.05 volts when a current of about 2 amperes is passed through the diode in the forward direction. The blocking current of such a diode is about 1500 volts, at 150° C., by a current of about 100 microamperes. Such a rectifier is able to withstand in the forward half wave a short lasting current of over 800 volts without damage, even when the current has an inductivity of about 1 millihenry.

As explained above, the thickness of the weakly p-type region is so chosen that the voltage drop measured between the two electrodes 2 and 3 is substantially within the range of 1.0 and 1.15 volts when a current of 1 amp. per $mm.^2$ is passed through the diode in the forward direction.

While in the foregoing the invention is described with particular reference to a diode, it will be understood that it is analogously applicable to other p-n junction devices such as silicon-controlled rectifiers in which one of the above-mentioned highly doped regions is contacted not by a metal electrode but by another doped region of the semiconductor crystal.

Such and other modifications and uses of the invention will be obvious to those skilled in the art, after a study of this disclosure, and are indicative of the fact that the invention can be given embodiments other than illustrated and described herein, without departing from the essential features of my invention and within the scope of the claims annexed hereto.

I claim:

1. In an electronic semiconductor device having a crystalline body of silicon with a weakly doped intermediate region and two highly doped surface regions of respectively opposite conductance types, located on opposite sides of said intermediate region and contacted by respective contacting means, one of said surface regions forming a p-n junction with said middle region, and the other surface region forming an ohmic junction with said intermediate region, each of said highly doped surface regions has a dopant concentration of about $10^{18}$ to $10^{20}$ atoms per $cm.^3$, the gradient of the dopant concentration in each highly doped region in the direction away from its junction has a value less than about $10^{17}$ $cm.^{-4}$, and said intermediate region has a dopant concentration of about $10^{15}$ atoms per $cm.^3$ maximal, recombination centers in the intermediate region, the ratio of dopant concentration in the intermediate region to that of the recombination centers corresponding to a voltage drop between said electrodes of about 1.0 to 1.15 volts at a forward current of 1 ampere per $mm.^2$ through said p-n junction.

2. An electronic semiconductor device having a crystalline body of silicon with a weakly acceptor-doped middle region and two surface regions diffusion-doped with phosphorus and boron respectively so as to form a p-n junction and an ohmic junction respectively with said middle region, contact means on said respective surface regions, each of said surface regions having a dopant concentration of about $10^{18}$ to $10^{20}$ atoms per $cm.^3$, the gradient of the dopant concentration in each highly doped zone in the direction away from its junction surface being less than about $10^{17}$ $cm.^{-4}$, and said middle region having a boron concentration of about $10^{15}$ atoms per $cm.^3$ maximal, recombination centers in the intermediate region, and having a ratio of the boron concentration in the intermediate region to that of the recombination centers corresponding to a voltage drop between said respective two contact means of about 1.0 to 1.15 volts at a forward current of 1 ampere per $mm.^2$ through said p-n junction.

References Cited by the Examiner

UNITED STATES PATENTS

| | | | |
|---|---|---|---|
| 2,689,930 | 9/1954 | Hall | 317—234 |
| 2,790,940 | 4/1957 | Prince | 317—234 |
| 2,843,516 | 7/1958 | Herlet | 317—234 |
| 2,908,871 | 10/1959 | McKay | 317—235 |
| 3,006,791 | 10/1961 | Webster | 317—235 |
| 3,085,310 | 4/1963 | Rutz | 317—234 |

JAMES D. KALLAM, *Acting Primary Examiner.*

A. M. LESNIAK, *Assistant Examiner.*